United States Patent
Ouyang

(10) Patent No.: US 7,759,790 B2
(45) Date of Patent: Jul. 20, 2010

(54) LIDLESS SEMICONDUCTOR COOLING

(75) Inventor: Chien Ouyang, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 628 days.

(21) Appl. No.: 11/707,327

(22) Filed: Feb. 16, 2007

(65) Prior Publication Data

US 2008/0197483 A1 Aug. 21, 2008

(51) Int. Cl.
*H01L 23/34* (2006.01)
*H01L 23/40* (2006.01)

(52) U.S. Cl. .............................. 257/720; 257/E23.084; 257/E21.001; 257/E23.08; 361/701; 361/704

(58) Field of Classification Search ............ 257/E32.08, 257/E23.098; 361/701
See application file for complete search history.

(56) References Cited

U.S. PATENT DOCUMENTS

| | | | |
|---|---|---|---|
| 6,766,817 B2 | 7/2004 | da Silva et al. | |
| 6,918,404 B2 | 7/2005 | da Silva et al. | |
| 7,066,586 B2 | 6/2006 | da Silva et al. | |
| 7,265,979 B2* | 9/2007 | Erturk et al. | 361/702 |
| 7,423,874 B2* | 9/2008 | Ouyang | 361/699 |
| 2002/0172022 A1* | 11/2002 | DiBene et al. | 361/761 |
| 2004/0246679 A1* | 12/2004 | Cromwell | 361/704 |
| 2005/0061496 A1* | 3/2005 | Matabayas | 165/185 |

* cited by examiner

*Primary Examiner*—Zandra Smith
*Assistant Examiner*—Tsz K Chiu
(74) *Attorney, Agent, or Firm*—Osha • Liang LLP

(57) ABSTRACT

A system for cooling a semiconductor includes a heat sink in thermal contact with the semiconductor, a thermal interface material (TIM) layer disposed between the heat sink and the semiconductor, and a picture frame support disposed between a substrate of the semiconductor and the heat sink, wherein the picture frame support encloses at least a portion of the semiconductor in a plane between the substrate and the heat sink, and wherein the picture frame support has a height that is greater than a height of the semiconductor.

9 Claims, 6 Drawing Sheets

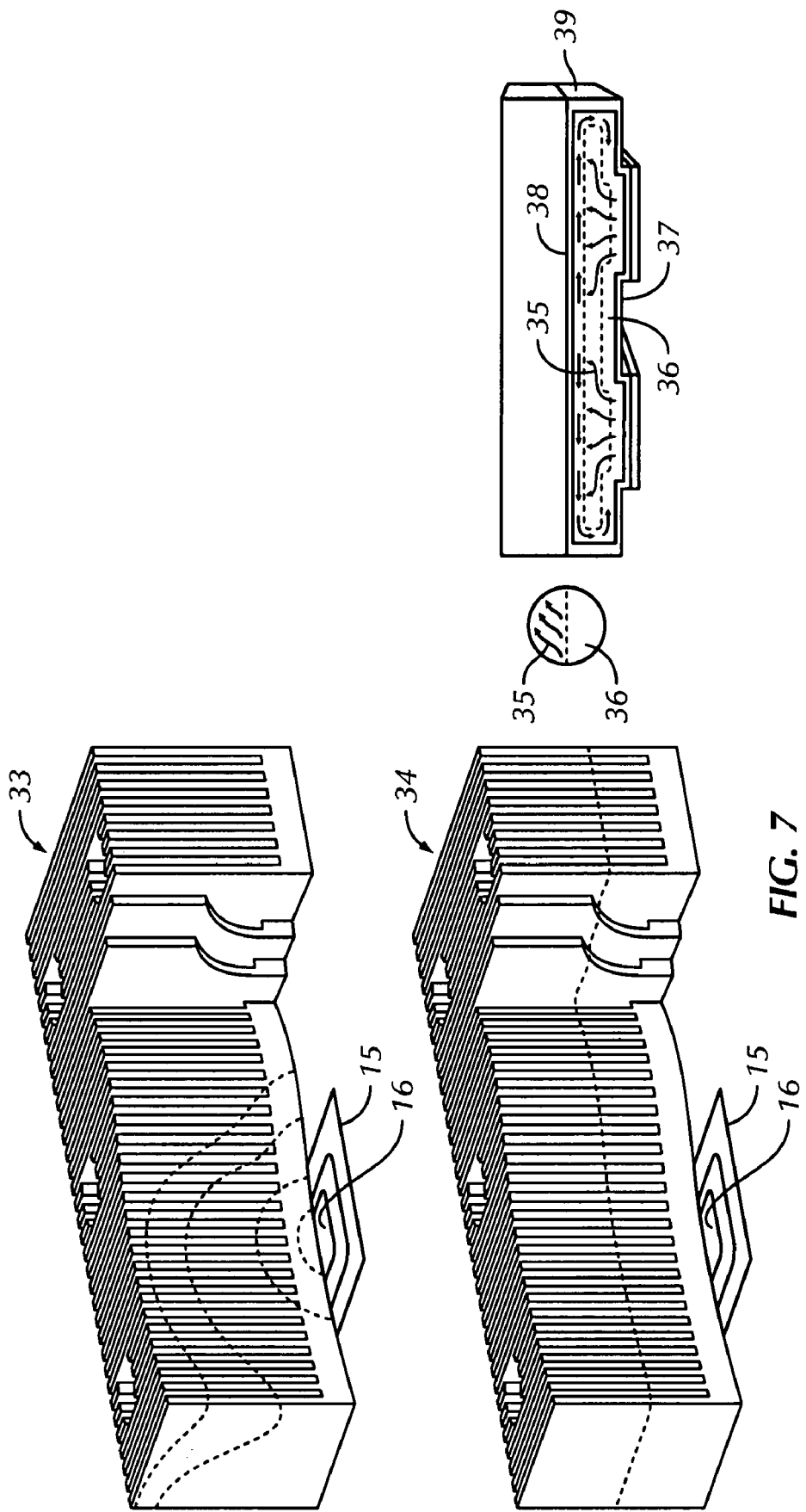

LIDLESS SEMICONDUCTOR COOLING

BACKGROUND

Computer cooling involves the removal of heat from computers and associated components, such as semiconductor devices. All semiconductor devices have some form of conduction resistance which leads to generation of heat when these devices are operated. Heat flow begins at the semiconductor junction through which electric current travels. This heat is conducted from the device body onto the package that the semiconductor is housed in, and then to the air. This heat energy increases the temperature of the semiconductor. If heat is not dissipated from the semiconductor fast enough, the semiconductor temperature may increase beyond the specified operating temperature, resulting in shorter component lifespans as well as problems such as system freezes or crashes.

A heat sink is an environment or object that absorbs heat from another object using thermal contact. Heat sinks are used to aid in the absorption of heat from the surface of a semiconductor. The goal of a heat sink is to effectively transfer heat away from the surface of the semiconductor to the surrounding air. The heat transfer can occur in three ways: conduction, convection and radiation. Conduction is the transfer of heat across matter. For example, heat is transferred from the surface of the semiconductor to the heat sink by conduction. Heat transfer through conduction can be increased by using materials with a high conduction coefficient, such as copper, silver, or gold.

Convection transfers heat energy by currents within a fluid. For example, convection occurs in the transfer of heat through currents from a heat sink to the surrounding fluid, such as air. If the currents are caused solely by a temperature gradient near the interface of the heat sink and the air, natural convection is responsible for the heat transfer. However, if the currents in the fluid are also influenced by external forces, such as current generated by a fan, then forced convection is used to transfer heat.

Radiation refers to electromagnetic radiation emitted from the surface of an object due to the object's temperature. Radiation is generated when heat from the movement of charged particles within atoms is converted into electromagnetic radiation. For example, infrared radiation is emitted by a heat sink that is heated from contact with a semiconductor. Heat transfer through a heat sink is affected by radiation because a warmer heat sink radiates more heat than a cooler heat sink.

SUMMARY

In general, in one aspect, the invention relates to a system for cooling a semiconductor, comprising a heat sink in thermal contact with the semiconductor, a thermal interface material (TIM) layer disposed between the heat sink and the semiconductor, and a picture frame support disposed between a substrate of the semiconductor and the heat sink, wherein the picture frame support encloses at least a portion of the semiconductor in a plane between the substrate and the heat sink, and wherein the picture frame support has a height that is greater than a height of the semiconductor.

In general, in one aspect, the invention relates to a method for cooling a semiconductor, comprising disposing a picture frame support around at least a portion of the semiconductor on a substrate of the semiconductor, applying a thermal interface material (TIM) layer to a surface of the semiconductor, and placing a heat sink on top of the TIM layer to create thermal contact with the semiconductor, wherein the picture frame support has a height that is greater than a height of the semiconductor.

Other aspects of the invention will be apparent from the following description and the appended claims.

BRIEF DESCRIPTION OF DRAWINGS

FIG. 7 shows a cavity-based heat sink in accordance with one or more embodiments of the invention.

DETAILED DESCRIPTION

Figure 1:
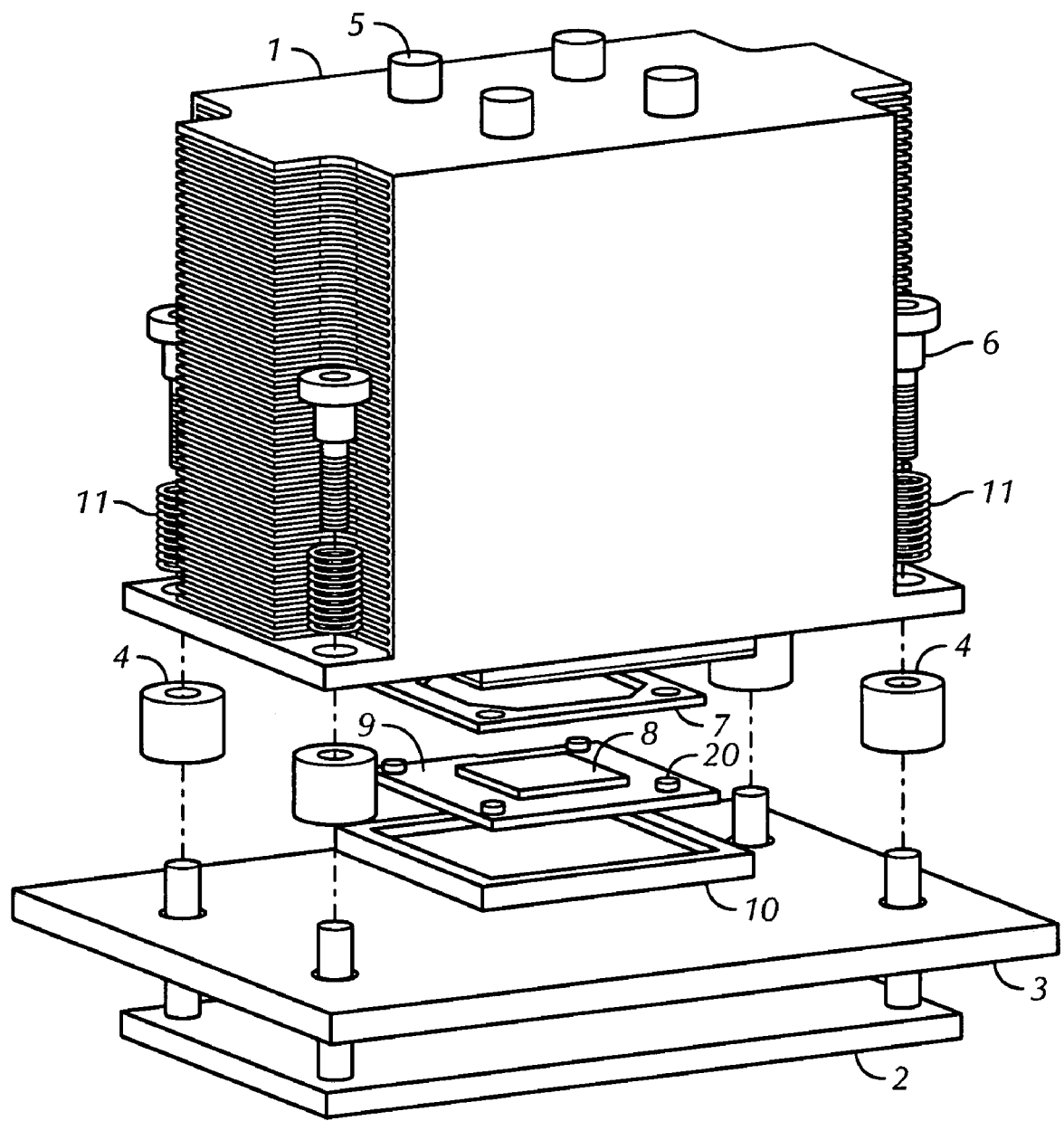
FIG. 1 shows a lidless heat sink assembly in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a method and apparatus to cool a semiconductor device, such as a microprocessor, central processing unit (CPU), graphics processing unit (GPU), etc. Specifically, embodiments of the invention provide a method and apparatus to cool a semiconductor using a lidless heat sink assembly. The lidless heat sink assembly allows more heat to be conducted from the semiconductor to the heat sink. Damage to the semiconductor from physical contact with the heat sink is prevented by using a picture frame support and one or more sets of hard stops between the semiconductor substrate and the heat sink or the semiconductor printed circuit board (PCB) and the heat sink. In addition, the picture frame support and hard stops allow the thickness of the thermal interface material (TIM) layer between the semiconductor and heat sink to be minimized. Embodiments of the invention further involve a heat sink base piece made of a high thermal conductivity material, such as carbon nanotube, diamond, and/or sintered composite. Heat tubes and cavity-based heat sinks allow for added heat transfer away from the semiconductor.

FIG. 1 shows a lidless heat sink assembly in accordance with one or more embodiments of the invention. The heat sink assembly includes a heat sink (1), bolster plate (2), printed circuit board (PCB) (3), two sets of hard stops (4, 20), a heat pipe (5), a set of screws (6), a picture frame support (7), a semiconductor (8), a substrate (9), a socket (10), and a set of springs (11). As shown in FIG. 1, pegs on the bolster plate (2) are threaded through a set of holes in the PCB (3). The pegs are also threaded through hard stops (4) on top of the PCB (3).

In one or more embodiments of the invention, the bolster plate (2) is used to locate and support the heat sink assembly.

The semiconductor (8) refers to a semiconductor device, such as a microprocessor, central processing unit (CPU), or other integrated circuit. The semiconductor (8) is attached on one surface to a substrate (9), which may be a silicon wafer or another PCB. The semiconductor (8) and substrate (9) are placed into a socket (10) on the PCB (3), which connects the semiconductor (8) to the PCB (3). For example, the semiconductor (8) may be a CPU of a computer, and the PCB (3) may be the motherboard of a computer. The CPU may then be connected to the motherboard using a pin grid array (PGA) socket (10).

Still referring to FIG. 1, the picture frame support (7) is placed between the substrate (9) and the base of the heat sink (1). In addition, the picture frame support (7) encloses the semiconductor (8) in a plane between the substrate (9) and the base of the heat sink (1). In one or more embodiments of the invention, the picture frame support (7) is used to offset any physical load from the heat sink (1) onto the semiconductor (8). Hard stops (20) may also be placed between the substrate (9) and the heat sink (1). In one or more embodiments of the invention, the picture frame support (7) is made of a flexible material, such as polytetrafluoroethylene (i.e., Teflon™ (Teflon is a registered trademark of Du Pont de Nemours and Company Corporation). The picture frame support (7) is described in greater detail below with reference to FIG. 2.

The hard stops (4, 20) of FIG. 1 may be used to further offset physical load from the heat sink (1) on the semiconductor (8). In addition, the hard stops (4) may be made of a material that is mechanically stiffer than the material of the picture frame support (7). For example, the hard stops (4) may be made of a material traditionally used for making heat sink lids, such as copper, aluminum, aluminum silicon carbide, or copper-infiltrated tungsten. Due to their higher mechanical stiffness, the hard stops (4) may be used to prevent the heat sink (1) from physically damaging the semiconductor (8) due to mechanical flex from the picture frame support (7), as well as control the thickness of a thermal interface material (TIM) layer between the semiconductor (8) and heat sink (1). Hard stops (4) are explained in further detail below with reference to FIGS. 3 and 6.

The heat sink (1) is attached to the PCB (3) using a set of screws (6). As mentioned above, the hard stops (4) prevent the heat sink (1) from physically damaging the semiconductor (8). The screws (6) are threaded through openings in the pegs of the bolster plate (2), hard stops (4), heat sink (1), and a set of springs (11). The springs (11) allow the heat sink (1) to move in a plane between the substrate and the heat sink. However, because the hard stops (4) prevent the heat sink (1) from physically damaging the semiconductor (8), the heat sink (1) is separated from the PCB (3) by at least the height of the hard stops (4). In one or more embodiments of the invention, the TIM layer (not shown) between the heat sink (1) and semiconductor (8) allows the heat sink (1) to thermally contact the semiconductor (8). In one or more embodiments of the invention, the height of the hard stops (4) determines the thickness of the TIM layer between the heat sink (1) and semiconductor (8). The TIM layer may be composed of thermal grease, such as silicone oil filled with aluminum oxide, zinc oxide, boron nitride, and/or pulverized silver.

The heat sink (1) may also include one or more heat pipes (5). In one or more embodiments of the invention, heat pipes (5) allow the heat sink (1) to conduct heat away from the semiconductor (8). As shown in FIG. 1, the heat pipe(s) (5) are oriented perpendicular to the plane of thermal contact between the heat sink and the semiconductor. The heat pipe (5) is explained in further detail below with reference to FIG. 4.

Figure 2:
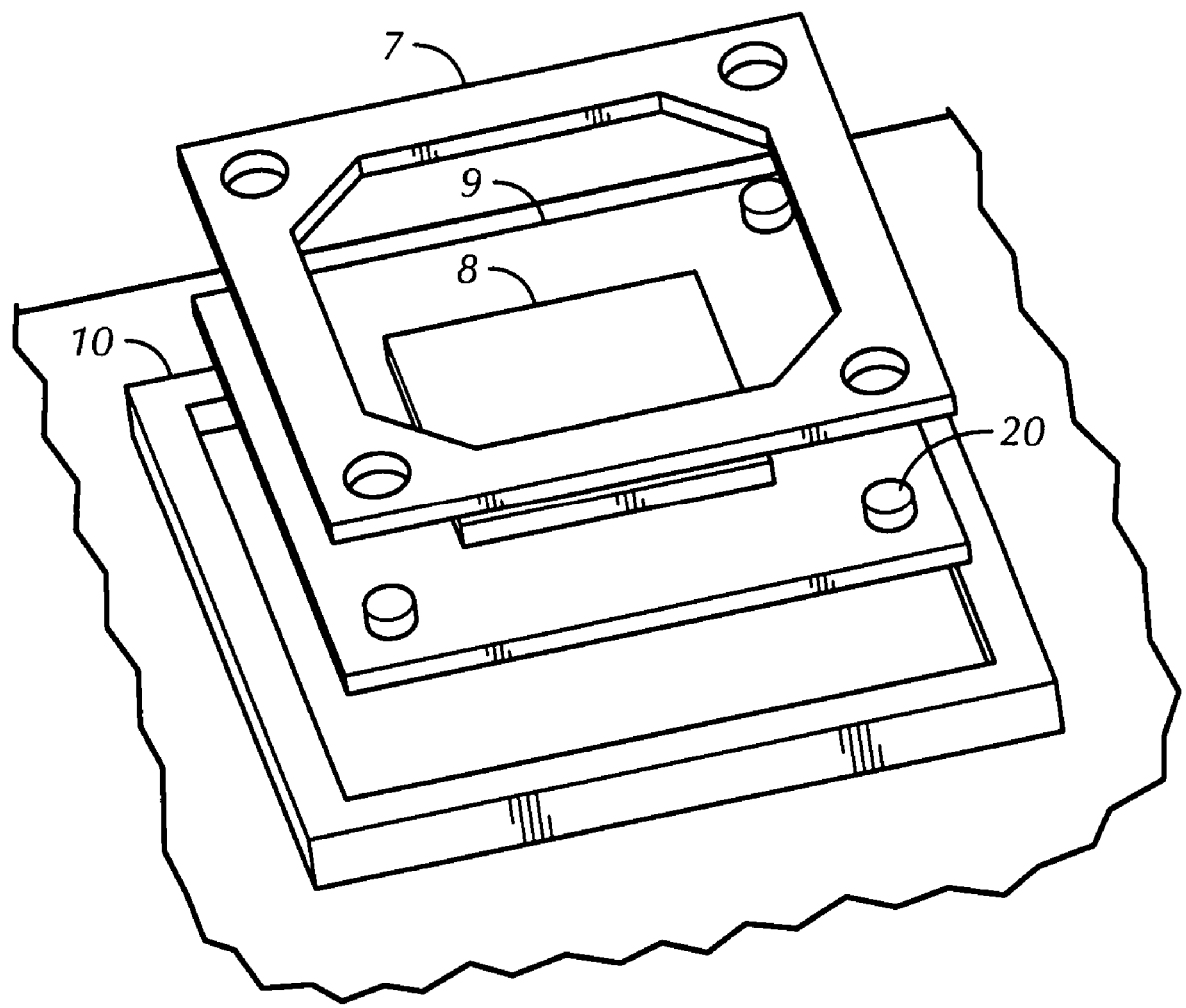
FIG. 2 shows a picture frame support assembly in accordance with one or more embodiments of the invention.

FIG. 2 shows a picture frame assembly in accordance with one or more embodiments of the invention. A semiconductor (8) on a substrate (9) is placed into a socket (10), as discussed in FIG. 1. A picture frame support (7) is then placed around the semiconductor (8) on top of the substrate (9). As mentioned above, the picture frame support (7) is configured to offset a physical load from a heat sink. In other words, the picture frame support (7) prevents the semiconductor (8) from damage due to physical contact with a heat sink. In one or more embodiments of the invention, the height of the picture frame support (7) is greater than the height of the semiconductor (8).

As shown in FIG. 2, a set of hard stops (20) is also placed on the substrate (9). Openings in the picture frame support (7) allow the hard stops (20) to pass through the picture frame support (7). As discussed above, the hard stops (2) may be made of a material that is mechanically stiffer than the material of the picture frame support (7). In addition, the height of the hard stops (2) may be less than the height of the picture frame support (7), but greater than the height of the semiconductor (8). As a result, the hard stops (20) may be used to prevent a heat sink from physically damaging the semiconductor (8) due to mechanical flex from the picture frame support (7). In addition, the height of the hard stops (2) may determine the thickness of the TIM layer (not shown) between the semiconductor (8) and the base of the heat sink.

Those skilled in the art will appreciate that the picture frame support (7) may be shaped differently than shown in FIG. 2. In addition, the picture frame support (7) may only enclose part of the semiconductor (8). Further, the hard stops (20) may be positioned within the picture frame support (7), outside the picture frame support (7), or in any combination of the two. The hard stops may also be shaped differently from those shown in FIG. 2.

Figure 3A:
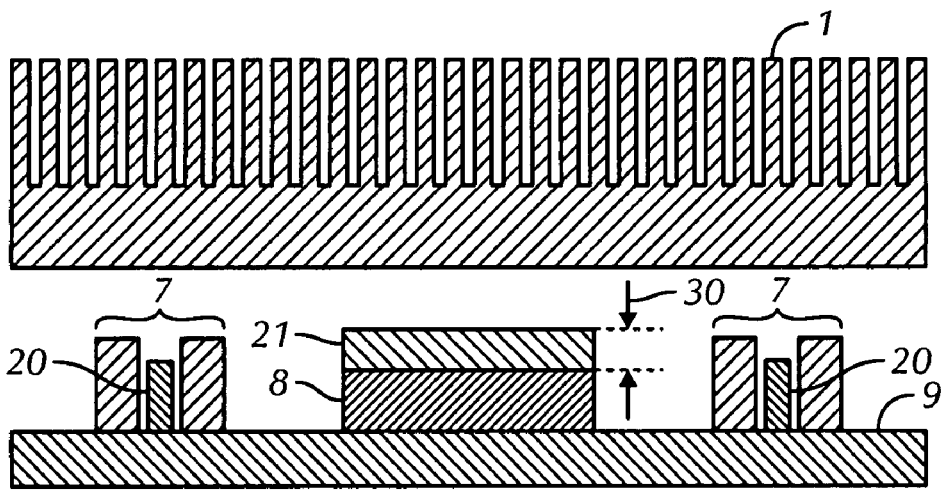
FIGS. 3A-3C show a hard stop mechanism in accordance with one or more embodiments of the invention.
Figure 3B:
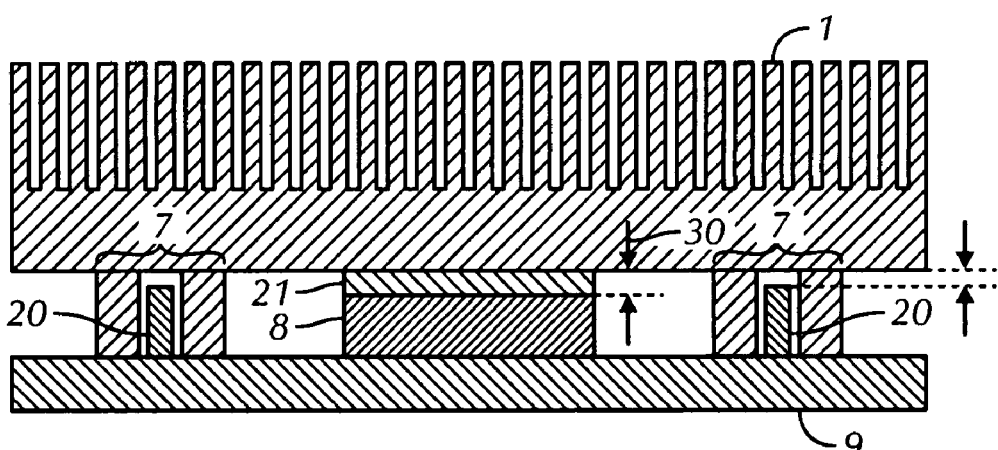
Figure 3C:
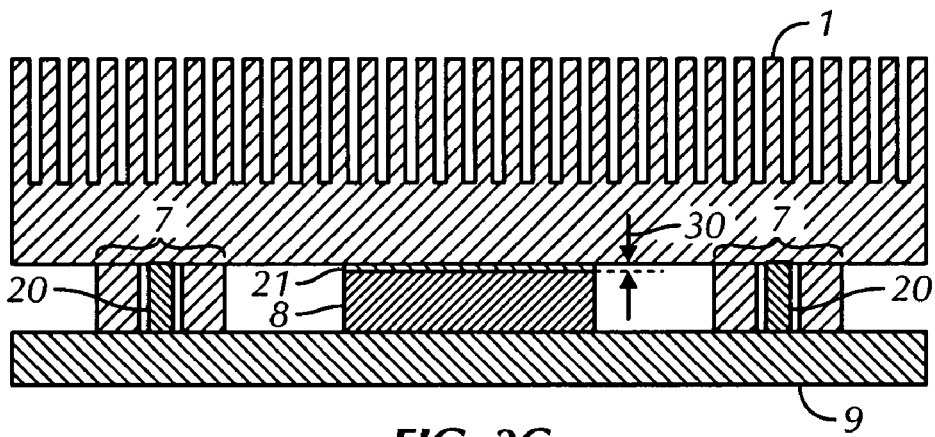

FIGS. 3A-3C show a hard stop mechanism in accordance with one or more embodiments of the invention. In FIG. 3A, a TIM layer (21) is applied to the top of the semiconductor (8). The TIM layer (21) also has a thickness (30) that is unaffected by the heat sink (1) because the TIM layer (21) and heat sink (1) are separated by a layer of air. For example, the TIM layer (21) may have a thickness (30) that is based on the application of the TIM to the semiconductor (8). In FIG. 3B, the picture frame support (7) is compressed by the weight of the heat sink (1), but the heat sink (1) does not contact any of the hard stops (20). In addition, the TIM layer (21) is reduced in thickness (30) from FIG. 3A due to contact with the base of the heat sink (1). The TIM layer (21) thickness (30) in FIG. 3B may be based on the weight of the heat sink (1), the flexibility of the picture frame support (7), and any external forces on the heat sink (1).

In FIG. 3C, the heat sink (1) is fully compressed. A full compression of the heat sink (1) may occur if, for example, the heat sink assembly is being transported. As a result of the compression, the heat sink (1) is in physical contact with the hard stops (20). However, the heat sink (1) does not physically damage (e.g., crack) the semiconductor (8) because the hard stops (20) are made of a mechanically stiffer material than the picture frame support (7) and do not flex like the picture frame support (7). In addition, as shown in FIG. 3C, the TIM layer (21) thickness (30) is further reduced from the thickness (30) shown in FIG. 3B to the difference in height between the semiconductor (8) and the hard stops (20). In other words, the thickness (30) of the TIM layer (21) may be reduced from the thickness based on application of the TIM layer (21) to the semiconductor (8) in FIG. 3A, to a partial compression of the picture frame support (7) in FIG. 3B, to a full compression limited by the height of the hard stops (20) in FIG. 3C.

Figure 4:
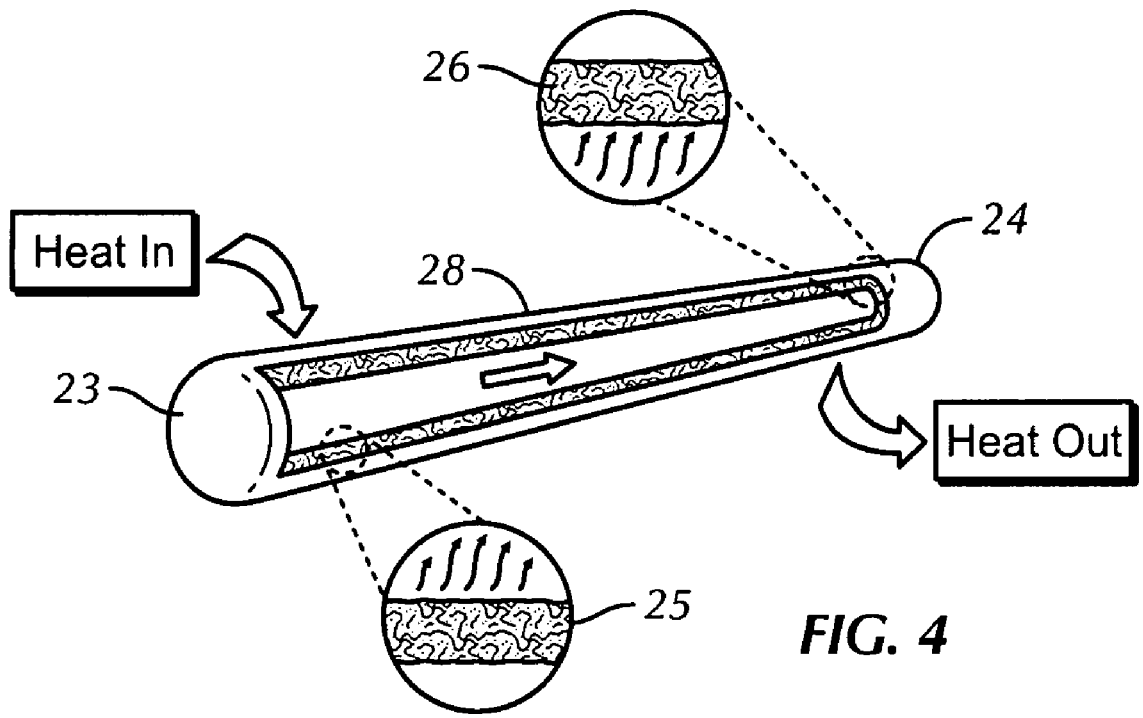
FIG. 4 shows a heat pipe in accordance with one or more embodiments of the invention.

FIG. 4 shows a heat pipe in accordance with one or more embodiments of the invention. In one or more embodiments of the invention, the heat pipe of FIG. 4 corresponds to the heat pipe(s) of FIG. 1. In one or more embodiments of the invention, a heat pipe is used to transfer heat away from a semiconductor device, such as a microprocessor, CPU, GPU, or other integrated circuit. The heat pipe includes a vacuum tight envelope (28), wick (26), and working fluid (25), as well as an evaporator (23) and a condenser (24). In one or more embodiments of the invention, the evaporator (23) is placed in thermal contact with the semiconductor. In one or more embodiments of the invention, a physical vacuum is created in the heat pipe, and the heat pipe is filled with working fluid (25), such as water, ethanol, ammonia, or mercury. In addition, the envelope (28) may only be filled with enough working fluid (25) to saturate the wick (26). The wick (26) may be made of a sintered metal powder, or any substance capable of drawing the working fluid (25).

In one or more embodiments of the invention, transfer of heat away from a semiconductor occurs because of the vaporization and condensation of the working fluid (25). As heat enters the evaporator (23) from the semiconductor, the liquid-vapor equilibrium of the working fluid (25) is disturbed, generating vapor at a slightly higher pressure than the equilibrium vapor pressure of the working fluid (25). The high pressure vapor travels to the condenser (24) end where a lower temperature (due to distance from the heat source) causes the vapor to condense. The condensed fluid (25) is forced back to the evaporator (23) by gravity and/or capillary forces caused by the wick (26).

Figure 5:
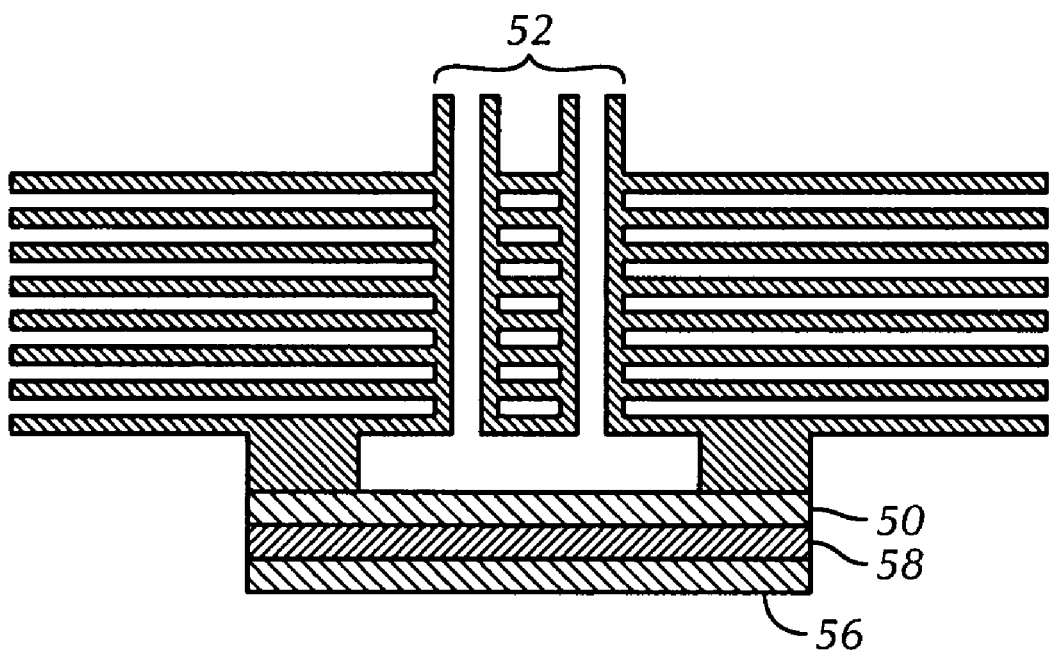
FIG. 5 shows a thermal interface in accordance with one or more embodiments of the invention.

FIG. 5 shows a thermal interface between a heat sink and a semiconductor in accordance with one or more embodiments of the invention. The heat sink includes a base piece (50) and one or more heat pipes (52) as described in FIG. 4. The base piece (50) is placed in thermal contact with a semiconductor (56) using a TIM layer (58). As mentioned before, the thickness of the TIM layer (58) may be determined by the height of hard stops (not shown) placed in the vicinity of the semiconductor (56).

In one or more embodiments of the invention, the base piece (50) is made of a material with a high thermal conductivity, such as carbon nanotube, sintered composite, and/or diamond. Alternatively, the base piece (50) may include areas of carbon nanotube that correspond to hot spots, or areas of increased heat output, in the semiconductor (56). The carbon nanotube areas of the base piece (50) thus allow heat from the hot spots of the semiconductor (56) to be transferred to the heat sink and/or heat pipes (52). In one or more embodiments of the invention, the high mechanical strength of the base piece (50) allows the base piece to be thinner than a base piece of copper or aluminum.

Figure 6:
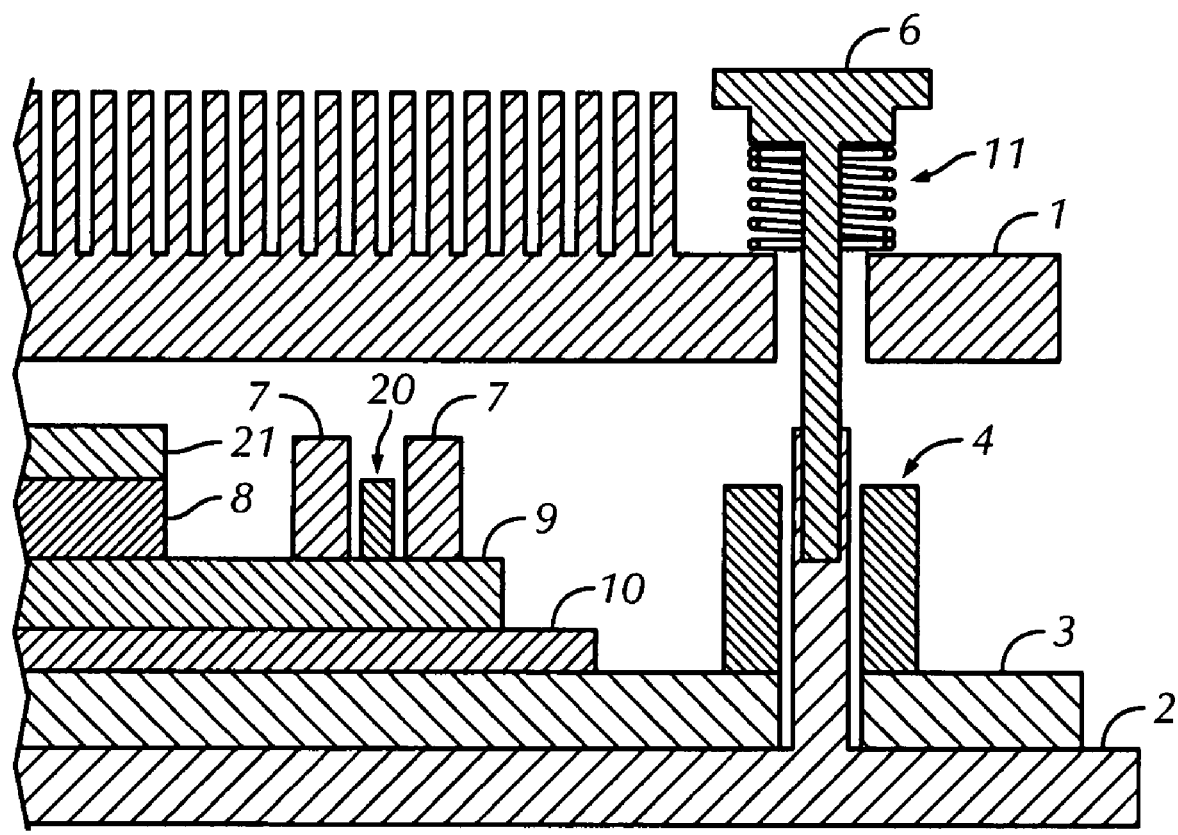
FIG. 6 shows a heat sink assembly with two sets of hard stops in accordance with one or more embodiments of the invention.

FIG. 6 shows a heat sink assembly with two sets of hard stops in accordance with one or more embodiments of the invention. As mentioned above, two sets of hard stops (4, 20) may be used to prevent the heat sink (1) from physically damaging the semiconductor (8). One set of hard stops (20) is placed between the substrate (9) and the heat sink (1). In one or more embodiments of the invention, the hard stops (20) pass through openings in the picture frame support (7) between the substrate (9) and the heat sink (1). In one or more embodiments of the invention, the hard stops (20) prevent the heat sink (1) from physically damaging and consequently damaging the semiconductor (8) when the heat sink (1) is fully compressed against the picture frame support (7).

In addition, a second set of hard stops (20) between the PCB (3) and the heat sink (1) provide further support of the heat sink (1) in the event of a full compression. The second set of hard stops (20) is held in place by a set of screws (6) passing through the heat sink (1), hard stops (20), PCB (3), and bolster plate (2). The screws (6) also pass through a set of springs (11), which prevent the heat sink (1) from excessive movement along the length of the screws (6) between the hard stops (20) and the tops of the screws (6). The second set of hard stops (20) may be made of a material that is different from the first set of hard stops (20). The second set of hard stops (20) may also limit the contact between the heat sink (1) and the semiconductor (8) at a different distance than the first set of hard stops (4). In other words, either the first set of hard stops (4) or the second set of hard stops (20) determine the thickness of the TIM layer (21) between the semiconductor (8) and the heat sink (1).

A system in accordance with one or more embodiments of the present invention includes a cavity-based heat sink (34), as shown in an exemplary configuration in FIG. 7. On the base (37) of the cavity-based heat sink (34) is a vapor chamber (39). The vapor chamber (39) is evacuated to create a vacuum and includes a saturated wick structure lining (36) on the inside walls. The base (37) of the cavity-based heat sink (34) is placed in thermal contact with the semiconductor (16), which is shown attached to a substrate (15). As heat is applied to the base (37), the working fluid (35) at that location immediately vaporizes which in turn fills the vacuum. Whenever the vapor (35) comes in contact with a cooler wall surface (38), it condenses, releasing its latent heat of vaporization. The condensed fluid (35) returns to heat source via capillary action in the wick structure. This capillary action enables the cavity-based heat sink to work in any orientation with respect to gravity. As in a heat pipe, the thermal resistance associated with spreading of the vapor is negligible, thus providing an effective means of transferring heat away from a concentrated source such as the semiconductor (16).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system comprising:
   a semiconductor disposed on a substrate that includes a first plurality of hard stops;
   a printed circuit board (PCB); and
   a heat sink assembly comprising:
      a heat sink,
      a thermal interface material (TIM) layer,
      a picture frame support that includes a plurality of openings corresponding to the first plurality of hard stops,
      a socket,
      a second plurality of hard stops, and
      a bolster plate,
   wherein the bolster plate is disposed on a side of the printed circuit board,
      the socket is disposed on an opposite side of the printed circuit board,
      the substrate is disposed in the socket and makes electrical contact with the PCB,
      the picture frame support is disposed on the substrate by aligning the plurality of openings with the first plurality of hard stops, the picture frame support encloses at least a portion of the semiconductor in a plane of the semiconductor, the TIM layer is disposed on the semiconductor, the heat sink is in thermal contact with the semiconductor, the heat sink is connected to the bolster plate by a plurality of screws threaded through the second plurality of hard stops and mating with the bolster plate, wherein the first and second plurality of hard stops offset a physical load from the heat sink on the semiconductor, and wherein a base piece of the heat sink comprises at least one selected from a group consisting of a carbon nanotube material, a sintered composite material, and a diamond material.

2. The system of claim 1, wherein the first plurality of hard stops each have a height:

that is greater than the height of the semiconductor, and that is less than the height of the picture frame support, wherein the first plurality of hard stops are made of a material of higher mechanical stiffness than a material of the picture frame support, and wherein the first plurality of hard stops are positioned to prevent the heat sink from physically damaging the semiconductor.

3. The system of claim 2, wherein a thickness of the TIM layer is determined based on the height of the first plurality of hard stops.

4. The system of claim 2, wherein the second plurality of hard stops each have a height that is greater than a height of the substrate and the height of the first plurality of hard stops combined, wherein the second plurality of hard stops are made of a material of higher mechanical stiffness than the material of the picture frame support, and wherein the second plurality of hard stops are positioned to prevent the heat sink from physically damaging the semiconductor.

5. The system of claim 4, wherein a thickness of the TIM layer is determined based on the height of the second plurality of hard stops.

6. The system of claim 1, further comprising:

a heat pipe passing through the heat sink perpendicular to a plane of thermal contact between the heat sink and the semiconductor.

7. The system of claim 1, wherein the carbon nanotube material is positioned on top of a hot spot of the semiconductor directly under the heat sink.

8. The system of claim 1, wherein the picture frame support comprises a polytetrafluoroethylene material.

9. The system of claim 1, wherein the heat sink comprises a cavity-based heat sink.

* * * * *